(12) United States Patent
Van Itallie et al.

(10) Patent No.: US 11,913,979 B2
(45) Date of Patent: Feb. 27, 2024

(54) COMPACT COMBINATION ELECTRICAL PANEL SAFETY MONITOR AND TEST POINT

(71) Applicant: Grace Technologies, Inc., Davenport, IA (US)

(72) Inventors: Bryan P. Van Itallie, Davenport, IA (US); Aaron Tuttle, McCausland, IA (US); Connor B. Meehan, Ann Arbor, MI (US); Roger S. Clarke, Santa Claus, IN (US)

(73) Assignee: GRACE TECHNOLOGIES, INC, Davenport, IA (US)

( * ) Notice: Subject to any disclaimer, the term of this patent is extended or adjusted under 35 U.S.C. 154(b) by 167 days.

(21) Appl. No.: 17/551,993

(22) Filed: Dec. 15, 2021

(65) Prior Publication Data
US 2023/0184814 A1   Jun. 15, 2023

(51) Int. Cl.
  *G01R 19/155* (2006.01)
(52) U.S. Cl.
  CPC .................... *G01R 19/155* (2013.01)
(58) Field of Classification Search
  CPC .... G01R 19/155; G01R 31/008; G01R 31/00; G01R 31/005; G01R 15/08; G01R 15/00; G01R 17/00; G01R 29/00; G01R 33/00; G01R 33/26; G01R 35/00; G01R 15/09; G01R 1/206; G05B 23/0256; G08B 25/14;
(Continued)

(56) References Cited

U.S. PATENT DOCUMENTS

| 6,703,938 B1 | 3/2004 | Clarke |
| 9,013,296 B2 * | 4/2015 | Clarke ................. G01R 19/155 340/514 |

(Continued)

FOREIGN PATENT DOCUMENTS

| CN | 201503480 U | * | 6/2010 |
| CN | 216083069 U | * | 3/2022 |
| EP | 0085772 A1 | * | 10/1982 |

OTHER PUBLICATIONS

Adkins et al., U.S. Appl. No. 17/451,000, filed Oct. 15, 2021, Compact Test Point Device.

(Continued)

*Primary Examiner* — Brian A Zimmerman
*Assistant Examiner* — Anthony D Afrifa-Kyei
(74) *Attorney, Agent, or Firm* — Goodhue, Coleman & Owens, P.C.

(57) ABSTRACT

An electrical safety monitor is provided. The electrical safety monitor may include a housing having a face. The electrical safety monitor further includes a plurality of line inputs for hardwiring a plurality of electrical connections. The electrical safety monitor further includes a plurality of test points with each of the test points corresponding to one of the line inputs, each of the plurality of test points accessible at the face of the housing. The electrical safety monitor further includes a line monitoring circuit having a plurality of light indicators and configured to produce light if voltage exists between any two of the line inputs to thereby indicate presence of voltage to a user. The electrical safety monitor further includes illumination areas associated with each of the test points, wherein each of the illumination areas is provided light by one or more of the plurality of light indicators.

20 Claims, 10 Drawing Sheets

(58) Field of Classification Search
CPC .. H01R 13/7135; H01R 13/713; H01R 13/00; H01R 12/70; H01R 24/00; H01R 33/00; H01R 13/66; H01R 13/70; H01R 13/7175; H01H 9/182; H01H 83/04
See application file for complete search history.

(56) References Cited

U.S. PATENT DOCUMENTS

| | | | |
|---|---|---|---|
| 2002/0074370 A1* | 6/2002 | Quintana | A45F 5/021 224/660 |
| 2007/0132458 A1* | 6/2007 | Allen, Jr. | G01R 19/155 324/523 |
| 2007/0170949 A1* | 7/2007 | Pak | G09G 3/006 324/760.01 |

OTHER PUBLICATIONS

Adkins et al., U.S. Appl. No. 17/523,262, filed Nov. 10, 2021, Smart Wireless Communication Device.
Adkins et al., U.S. Appl. No. 17/529,579, filed Nov. 18, 2021, Wireless Voltage Measurement, Testing and Analytics System.
Breitsprecher et al., U.S. Appl. No. 29/780,030, filed Apr. 22, 2021, Voltage Indicator With Test Points.

* cited by examiner

COMPACT COMBINATION ELECTRICAL PANEL SAFETY MONITOR AND TEST POINT

FIELD OF THE INVENTION

The present invention relates to electrical safety. More particularly, but not exclusively, the present invention relates to electrical panel safety monitoring and test points.

BACKGROUND

The present invention relates to electrical safety, and more particularly to monitoring of circuits such as 1000 VAC or 1500 VDC voltages using voltage indicators. A voltage indicator is generally a low cost device that pre-verifies electrical isolation before maintenance personnel open a control panel and risk exposure to hazardous voltages. Typically mounted to the panel exterior and hardwired into the load side of the main disconnect, this device provides electrical maintenance with an additional safety value. Easy to apply, low cost, quick installation, and inherent reliability makes a voltage indicator a very effective electrical safety device.

Creating and insuring an electrically safe work condition is critical for electricians performing maintenance on de-energized systems. The presence of voltage is the only determining factor if an electrical accident or an arc flash can possibly occur—No voltage, No accident, No arc flash. "Voltage or no voltage" is also the basis of the NFPA 70E's (National Fire Protection Association Standard's for Electrical Safety Requirements for Employee Workplaces) two primary themes: a) establishing an electrically safe work condition, and b) achieving safety while working on energized systems. A voltage warning indicator is like a 'hard wired voltmeter' with the advantage that it needs no power supply or batteries because it is powered from the same 'voltage' that it indicates. A voltage indicator is an additional safety measure between maintenance personnel and hazardous voltage.

U.S. Pat. No. 6,703,938 to Clarke, herein incorporated by reference in its entirety, illustrates one type of electrical safety monitor. Despite the advances of Clarke and other prior art devices, problems remain. In particular, it would be useful to not only provide a voltage warning indicator but also the ability to conduct a full absence of voltage test required as part of a lock-out/tag-out process without exposing the electrician to unsafe risk of electrical shock or arc flash. Moreover, it would be advantageous to do so in a compact combination while still maintaining UL spacing requirements associated with circuits carrying up to 1000 VAC or 1500 VDC. Therefore problems remain.

SUMMARY

Therefore, it is a primary object, feature, or advantage of the present invention to improve over the state of the art.

It is a further object, feature, or advantage of the present invention to provide an electrical panel safety monitor which includes test points.

It is a still further object, feature, or advantage of the present invention to provide an electrical panel safety monitor which includes test points and is compact.

Another object, feature, or advantage is to provide an electrical panel safety monitor which may be used to indicate presence of voltage on three-phase connections and also allow for probing test points to determine voltage between different test points.

Yet another object, feature, or advantage is to provide an electrical panel safety monitor which Yet another object, feature, or advantage is to provide separate voltage test and test point circuits within a single compact housing.

Another object, feature, or advantage is to provide a housing with a face on which both test points and illuminated areas indicative of presence of voltage may be positioned.

Yet another object, feature, or advantage is to use modern miniature and flexible circuit elements, light pipes, and electrical potting compound to allow a voltage indicator circuit and a test point circuit to be placed in close proximity while maintaining UL spacing requirements associated with circuits carrying up to 1000 VAC or 1500 VDC. B A further object, feature, or advantage is to improve electrical safety by enabling an electrician to have both visual indication of the presence of voltage at a panel and to conduct the full absence of voltage test required as part of the lock-out/tag-out process without exposing the electrician to unsafe risk of electrical shock or arc flash.

A still further object, feature, or advantage is to use light pipes enable the voltage indicator LEDs to flash in rings around the test points for clear indication of which circuit has voltage associated with it.

Another object, feature, or advantage is to provide a clear, yet waterproof, lockable cover provides environmental ratings as appropriate for use in most industrial applications (UL Type 4, 4X, 12, 13).

One or more of these and/or other objects, features, or advantages of the present invention will become apparent from the specification and claims that follow. No single embodiment need provide each and every object, feature, or advantage. Different embodiments may have different objects, features, or advantages. Therefore, the present invention is not to be limited to or by any objects, features, or advantages stated herein.

According to one aspect an electrical safety monitor is provided. The electrical safety monitor may include a housing having a face. The electrical safety monitor further includes a plurality of line inputs for hardwiring a plurality of electrical connections, The electrical safety monitor further includes a plurality of test points with each of the test points corresponding to one of the line inputs, each of the plurality of test points accessible at the face of the housing. The electrical safety monitor further includes a line monitoring circuit having a plurality of light indicators and configured to produce light if voltage exists between any two of the line inputs to thereby indicate presence of voltage to a user. The electrical safety monitor further includes illumination areas associated with each of the test points, wherein each of the illumination areas is provided light by one or more of the plurality of light indicators. Each of the illumination areas may be positioned around a corresponding one of the test points. The electrical safety monitor may further include light pipes for conveying light from the plurality of light indicators to the illumination areas. Each of the test points may comprise a conductive well for insertion of a test probe. The plurality of line inputs may include an L1, an L2, an L3, and a GND three-phase connection. The electrical safety monitor may include a voltage test circuit electrically connected to the plurality of test points. The voltage test circuit may be associated with a voltage test circuit board. The voltage test circuit board may be a flexible circuit board. The line monitoring circuit may be associated with a line monitoring circuit board. The line monitoring circuit board may be a flexible circuit board. The electrical safety monitor may further include an electrical potting compound wherein at least a portion of electrical compound separates one or more components of the line monitoring circuit board from the voltage test circuit board. The electrical safety monitor may further include a transparent cover operatively connected to the housing for covering the face of the housing when the transparent cover is in a closed position.

According to another aspect, an electrical safety monitor includes a housing having a face, a plurality of input lines, and a line monitoring circuit board disposed within the housing and having a voltage indicator circuit associated therewith, the voltage indicator circuit comprising a plurality of visual indicators such that there is at least one of the plurality of visual indicators corresponding with each of the plurality of input lines. The electrical safety monitor may further include a voltage test circuit board disposed within the housing and having a voltage test circuit associated therewith. The electrical safety monitor may further include a plurality of test points positioned at the face and electrically connected to the voltage test circuit such that each of the plurality of the test points corresponds with one of the plurality of input lines. The electrical safety monitor may further include a plurality of illumination areas positioned at the face, wherein each of the plurality of illumination areas is positioned around a corresponding one of the test points. Each of the illumination areas may fully encircle a corresponding one of the test points. The electrical safety monitor may further include light pipes for conveying light from the plurality of visual indicators to the illumination areas. Each of the test points may further include a conductive well for insertion of a test probe. The plurality of line inputs may include an L1, an L2, an L3, and a GND three-phase connection. The voltage test circuit board may be a flexible circuit board. The line monitoring circuit board may be a flexible circuit board. The electrical safety monitor may further include an electrical potting compound wherein at least a portion of electrical compound separates one or more components of the line monitoring circuit board from the voltage test circuit board.

BRIEF DESCRIPTION OF THE DRAWINGS

Illustrated embodiments of the disclosure are described in detail below with reference to the attached drawing figures, which are incorporated by reference herein.

DETAILED DESCRIPTION

This invention combines a voltage indicator or line monitoring circuit such as that disclosed in U.S. Pat. No. 6,703,938, hereby incorporated by reference in its entirety, with a voltage test circuit such as a parallel impedance-protected circuit that terminates in standard meter probe test points into a small form factor to easily mount on an industrial electrical panel. Use of modern miniature and flexible circuit elements, light pipes, and electrical potting compound enables these two circuits to be placed in close proximity while maintaining UL spacing requirements associated with circuits carrying up to 1000 VAC or 1500 VDC. By providing both circuits in the same package, this enables an electrician to have both visual indication of the presence of voltage at the panel and to conduct the full absence of voltage test required as part of the lock-out/tag-out process without exposing the electrician to unsafe risk of electrical shock or arc flash. Light pipes enable the voltage indicator LEDs to flash in rings around the test points for clear indication of which line input has voltage associated with it. The form factor of this invention may be as shown described in Design Patent Application 29/780,030, hereby incorporated by reference in its entirety. A clear, yet waterproof, lockable cover may be used to provide environmental ratings as appropriate for use in most industrial applications (e.g. UL Type 4, 4X, 12, 13).

Figure 1:
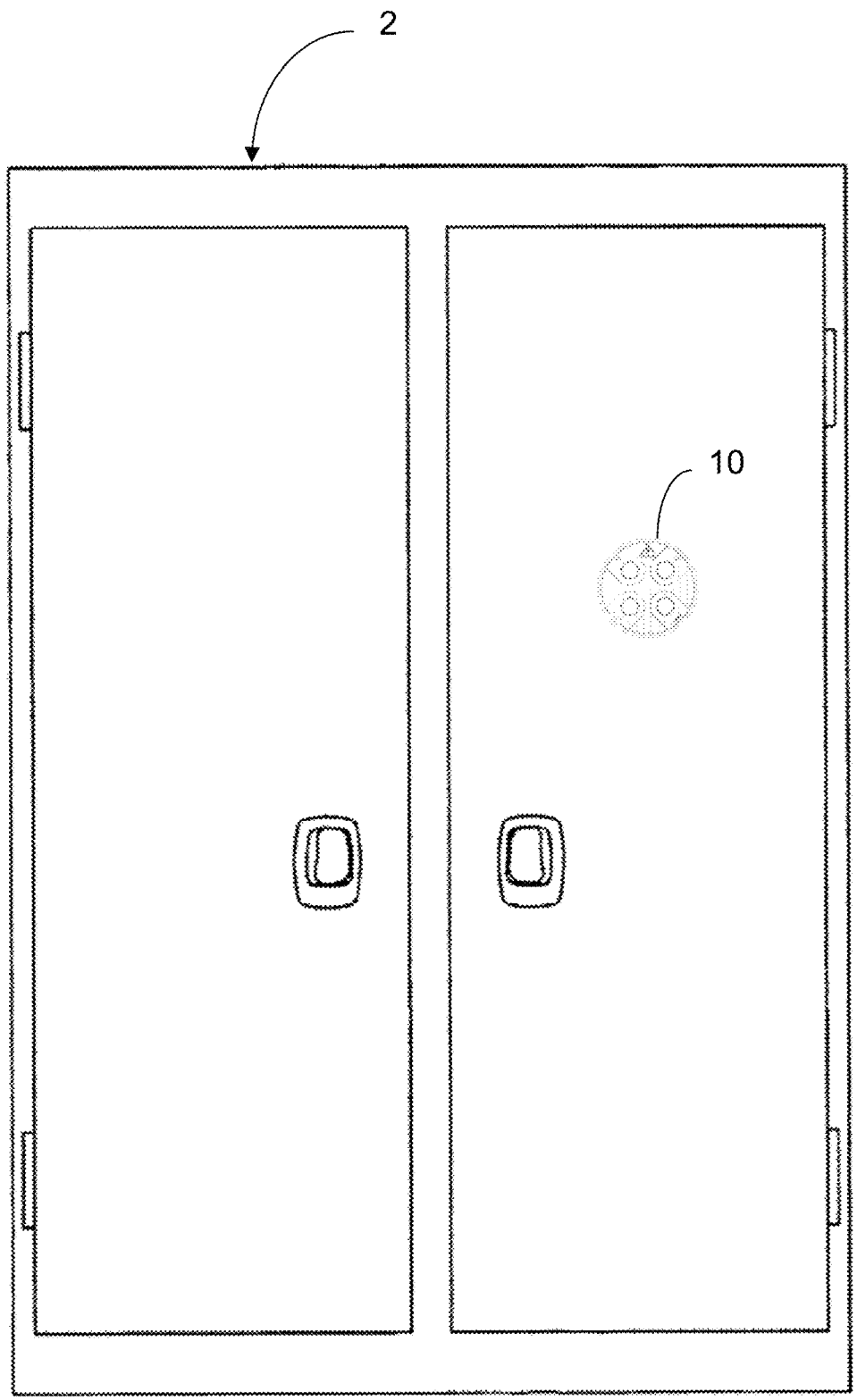
FIG. 1 is a view of a cabinet or enclosure to which an electrical safety monitor with test points is mounted.

FIG. 1 is a view of one embodiment of the present invention. A control cabinet 2 is shown. A device 10 is shown which is mounted to the control panel cabinet 2. The device 10 may be a permanent electrical safety device (PESD) that allows qualified individuals to perform an absence of voltage test (AVT) from outside of the electrical cabinet. The device 10 may be mounted directly on any enclosure with the option to test either the line side or the load side.

Figure 2:
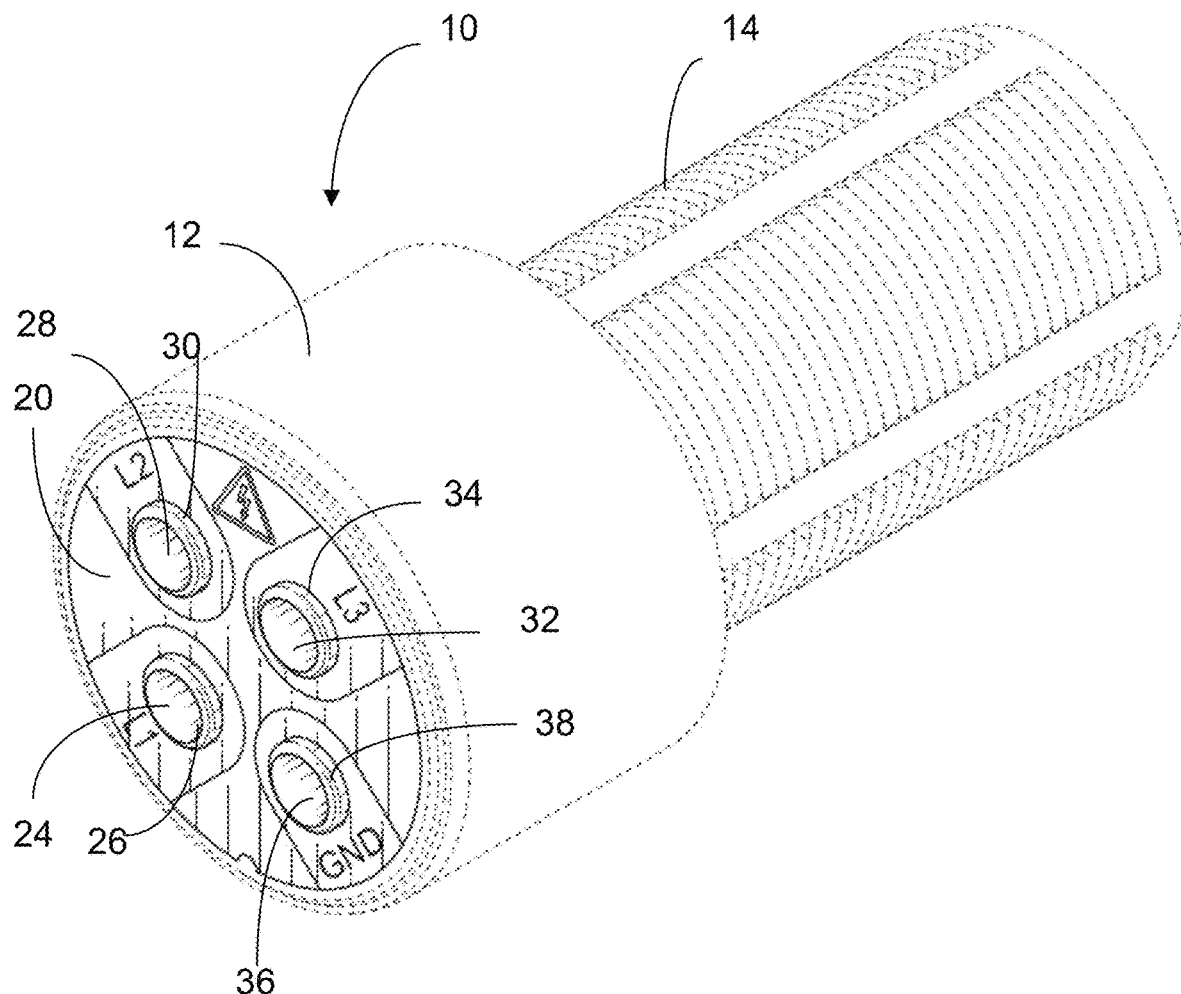
FIG. 2 is a perspective view of the electrical safety monitor with test points.

FIG. 2 illustrates the device 10. The device 10 has a housing 12 with a threaded portion 14. A face 20 is shown. The device 10 provides for voltage indication and for providing test points. On the face 20 includes test points 24, 28, 32, 36. Each of the test points 24, 28, 32, 36 is associated with a different input line or phase and may be in the form of a conductive well for receiving a test probe. Thus, an operator could access a L1 voltage through test point 24, a L2 voltage through test point 28, a L3 voltage through test point 32, and GND through test point 36. Each of the test points may be hardwired directly to energy sources and allows for measurement of AC/DC voltages by inserting insulated meter probes into any two test points to take a voltage reading of either phase to phase or phase to ground. The test points may be protected by impedance to limit the maximum current possible in the event of a short circuit and single component failure to less than 4 milliamps while providing an accurate voltage reading within 3.3% of true voltage. This provides accurate voltage readings without the risk of shock or arc.

Also as shown in FIG. 2, there are illumination areas 26, 30, 34, 38 associated with each of the test points 24, 28, 32, 36. The illumination areas 26, 30, 34, 38 may be in the form of rings which extend around the corresponding test points. Each of the illumination areas 26, 30, 34, 38 may be illuminated to show the presence of voltage by illuminating the area. The illumination areas 26, 30, 34, 38 may receive light from visual indicators such as LEDs or other light sources disposed within the housing. The light may be piped to the corresponding illumination areas 26, 30, 34, 38. Thus, an individual may readily identify which of the line inputs have voltage present prior to making any measurements. In some embodiments, each of the visual indicators may flash at a rate associated with the voltage present such that a higher flash rate may generally indicate a higher voltage. Thus, an individual may be alerted as to the presence of voltage as well as an indication of magnitude of the voltage present.

Although a three-phase power connection is shown as is typically used for AC power lines, the circuit may be modified to accommodate other types of power connectors. For example, instead of a three-phase power connection, a single-phase power connection may be monitored in which case there would need only be two power line inputs. Similarly, a five-wire power connection may be used which include a first line input, a second line input, a third line input, a ground, and a neutral connection. It is also to be understood that the circuit may also be used for DC voltage lines as well as AC voltage lines and thus the same device may be used in a wide range of applications and environments.

Figure 3:
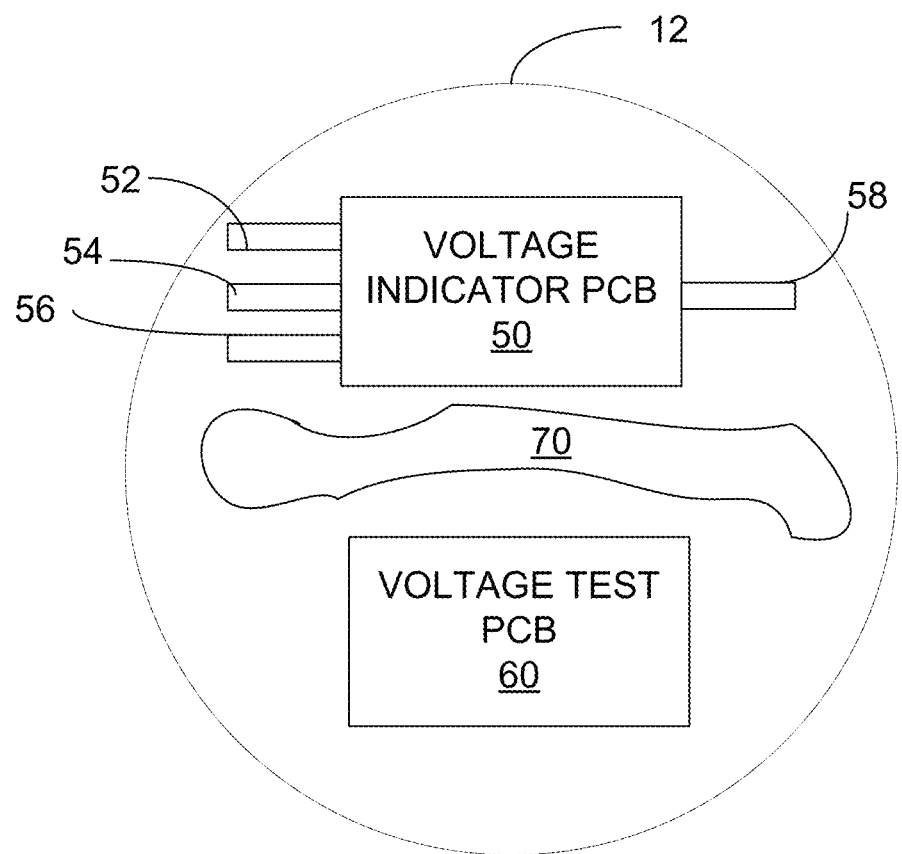
FIG. 3 is a block diagram of the electrical safety monitor with test points.

FIG. 3 is a block diagram illustrating the device 10. The device 10 has a housing 12. Disposed within the housing 12 is both a voltage indicator or line monitoring printed circuit board (PCB) 50 and a voltage test printed circuit board (PCB) 60. Each of the line monitoring PCB 50 and the voltage test PCB 60 may be flexible circuit boards. In addition, an electrical potting compound 70 may be used to further separate and isolate components from the line monitoring PCB 50 and the voltage test PCB 60. Thus, these two parallel circuits may be disposed within a housing 12 with a compact form factor while maintaining Underwriter Laboratories (UL) required spacing between components associated with 1000 VAC/1500 VDC circuits. Thus, the housing 12 with its compact form factor allows, for example, the device to be installed using a standard 30 mm electrical panel knockout. There are a number of light pipes 52, 54, 56, 58 associated with the line monitoring printed circuit board 50. Each of the light pipes 52, 54, 56, 58 may provide for piping or conveying light from one or more light sources associated with the line monitoring PCB 50 which may be in the form of LEDs to the face of the device, such as to the rings located on the face such as those best shown in FIG. 2.

The line monitoring printed circuit board 50 may comprise a circuit such as that shown and described in U.S. Pat. No. 6,703,938, hereby incorporated by reference in its entirety. The line monitoring circuit may be enhanced to reduce the overall power draw while allowing a wider range of detectable voltage inputs.

The light pipes 52, 54, 56, 58 may be used to route the flashes from voltage indicator LEDs to rings or other illumination areas associated with each of the test points, thus clearly identifying which circuit has voltage on it. This makes it intuitive for the electrician performing the test to know which circuit lines have voltage and which ones are being measured at any time. The use of these light pipes also enables the placement of the visual indicator immediately adjacent to the higher voltage test point components without violating UL spacing requirements.

The use of flexible circuit boards 50, 60 enables the line monitoring circuit to be on a completely separate circuit board 50 from the voltage test circuit on the voltage test circuit board 60 while bringing both the LED indicators and the voltage test points to a common face location. It also allows for both circuits to be powered from a common set of wires, reducing the chance of errors during installation into the electrical panel.

Figure 4:
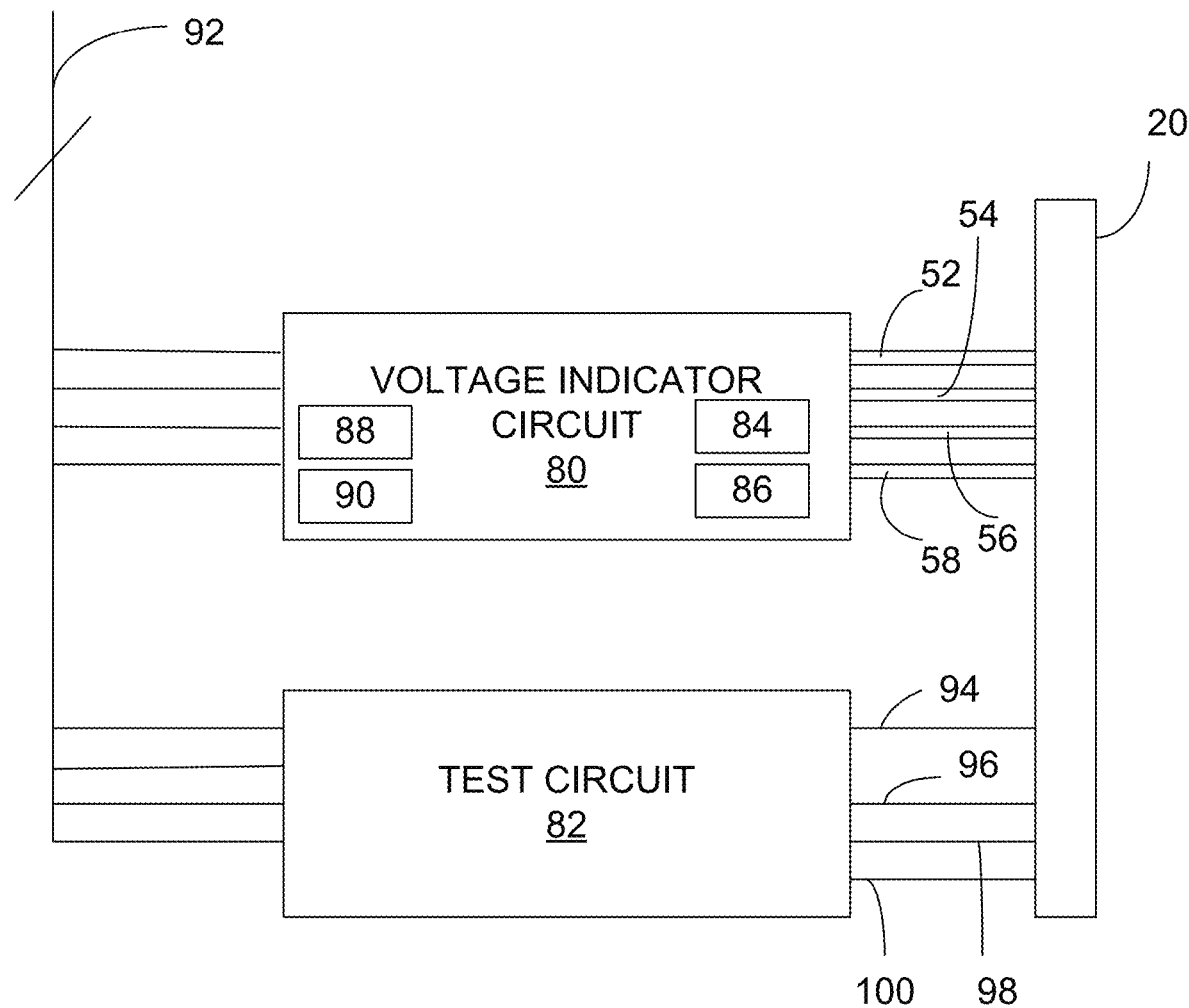
FIG. 4 is a block diagram showing a voltage indicator circuit and a test circuit.

FIG. 4 is a block diagram of circuitry for the device. A voltage indicator circuit 80 is shown such as may be mounted on or otherwise associated with the voltage indicator PCB. A voltage test circuit 82 is shown such as may be mounted on or otherwise associated with the voltage test PCB. The voltage indicator circuit may include a plurality of light sources or light indicators 84, 86, 88, 90 which may be LEDs. Light pipes 52, 54, 56, 58 may be used to convey light from the light indicators 84, 86, 88, 90 to the face 20. A plurality of line inputs 92 are shown which are electrically connected to both the voltage indicator circuit 80 and the test circuit 82. A plurality of electrical connections 94, 96, 98, 100 are shown which connect test points on the face 20 with the test circuit 82.

The device may be designed to have different configurations for use in 3-phase AC, 50/60/400 Hz (Delta or Wye configurations), single-phase AC, or DC applications up to 1000 VAC/1500 VDC with indications and test points for each phase, neutral, and ground. A transparent, waterproof, tool-access cover (not shown) enables the voltage indication to be clearly seen while protecting the circuit from environmental hazards and meeting UL Type ratings of 4, 4X, 12, and 13 or other applicable ratings or standards.

Figure 5:
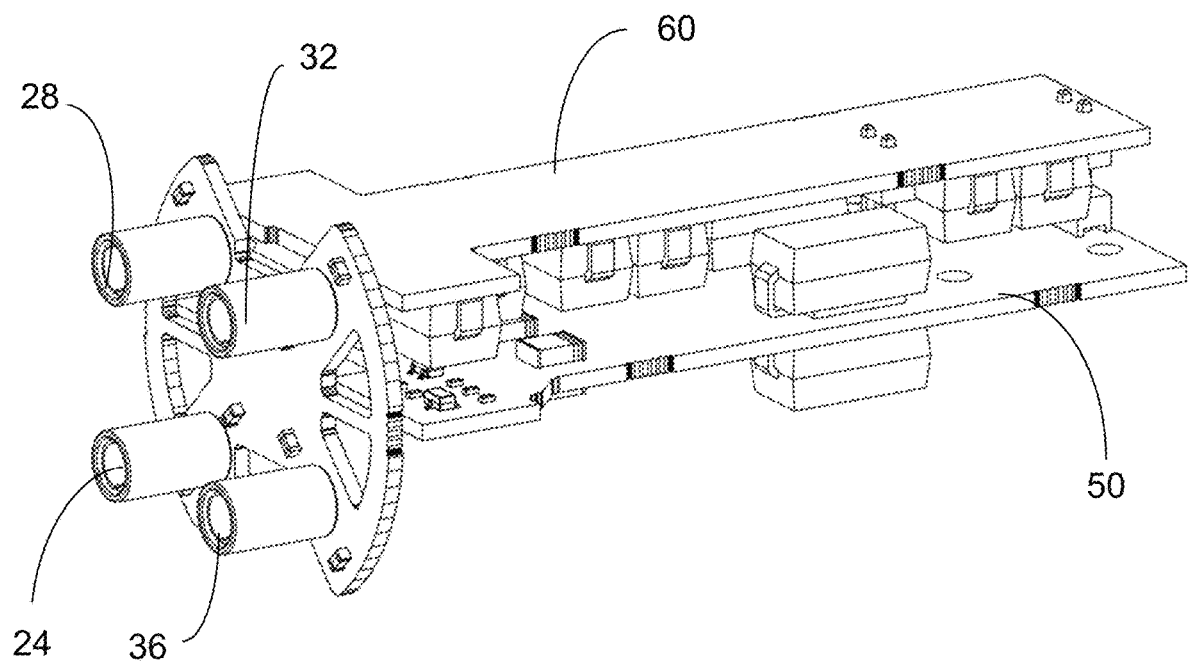
FIG. 5 further illustrates a voltage indicator or line monitoring circuit board and a voltage test circuit board.

FIG. 5 further illustrates a voltage indicator circuit board 50 and a voltage test circuit board 60 and further shows test points 24, 28, 32, 36. Electrical potting compound (not shown) may be used to separate components of the two circuit boards 50, 60 to provide for electrical isolation while allowing for the small package size.

Figure 6:
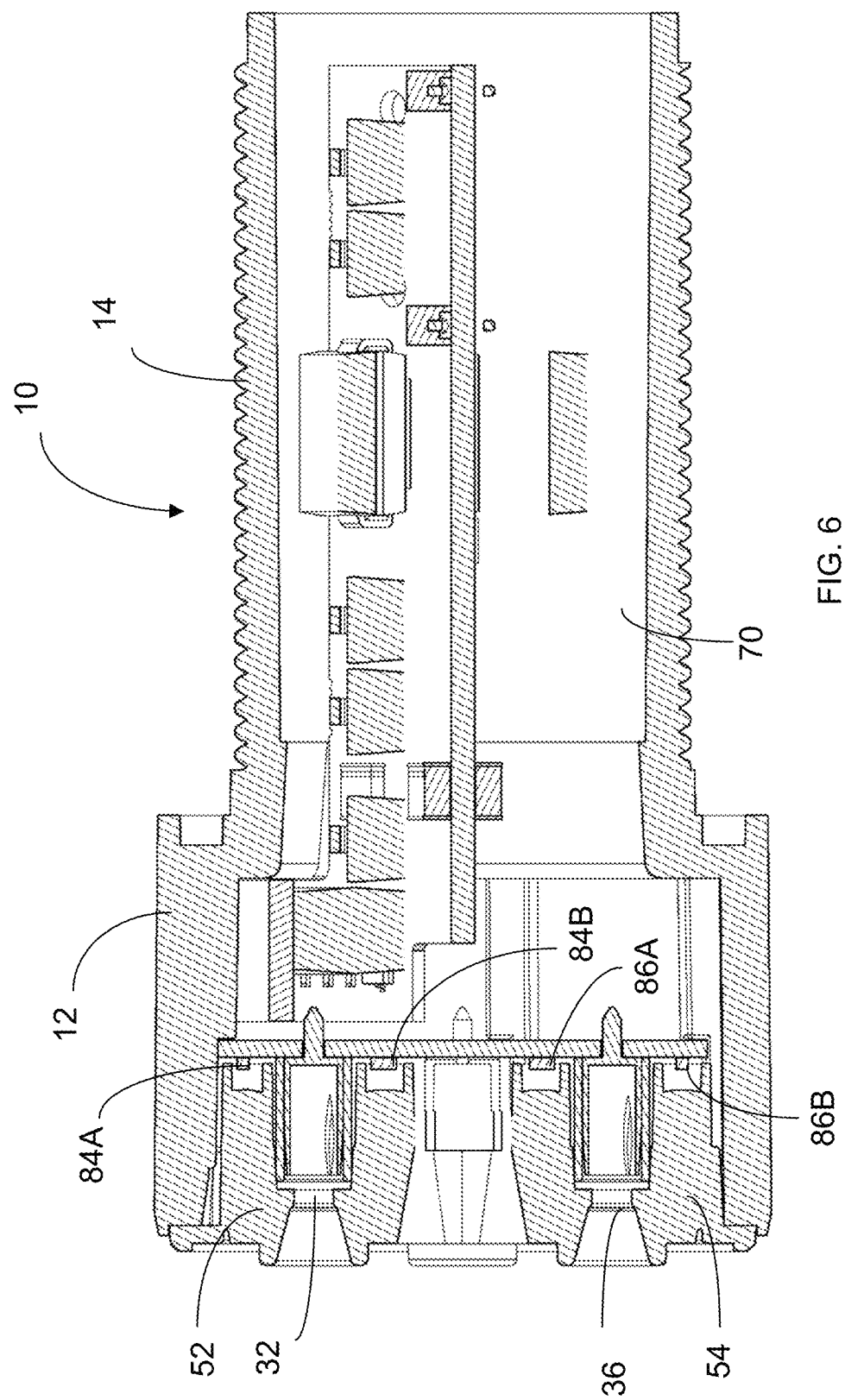
FIG. 6 is a cross sectional view of the device with the cross-section taken through the test points.
Figure 7:
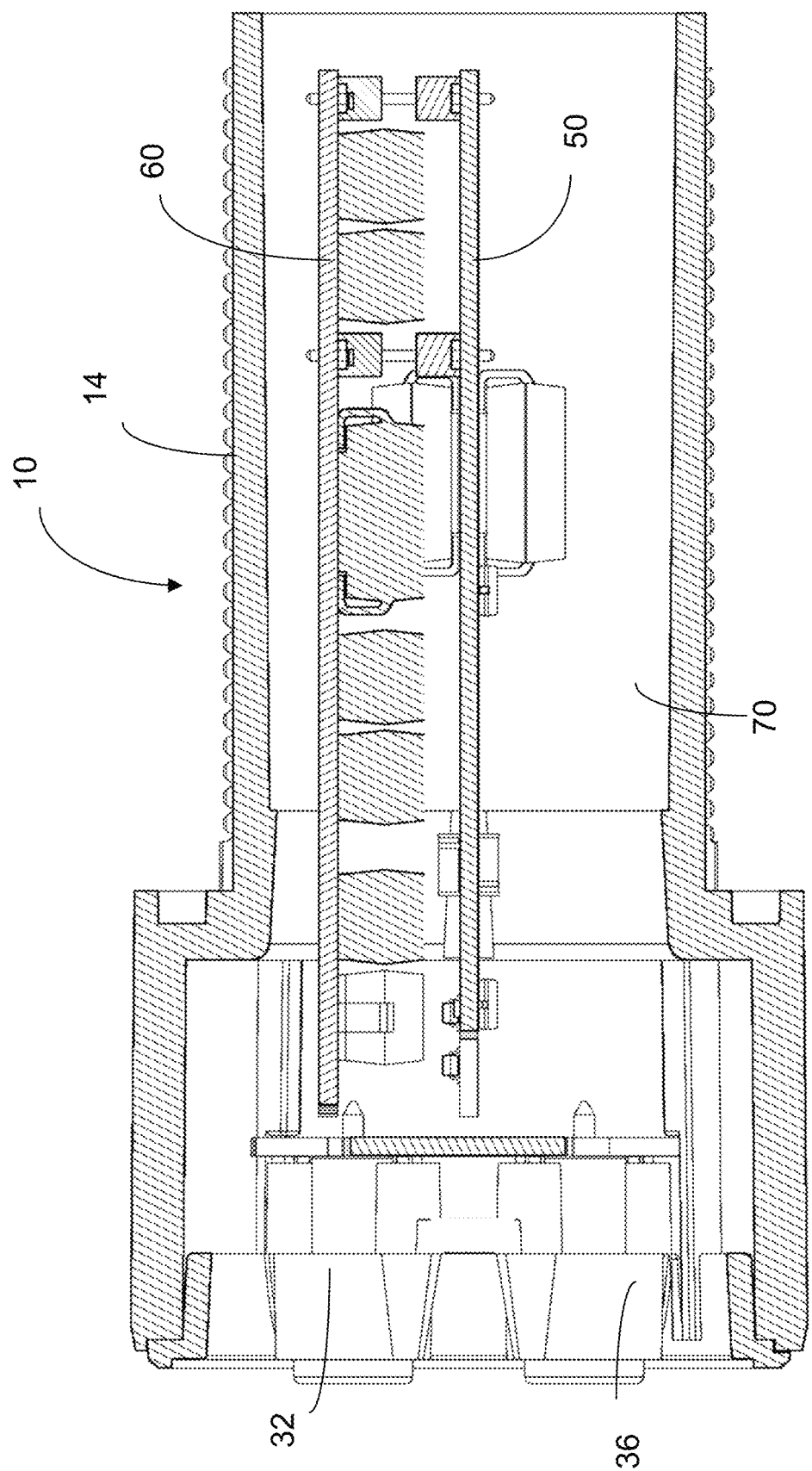
FIG. 7 is a cross sectional view of the device with the cross-section taken perpendicular to the circuit boards so that both circuit boards may be more clearly shown.

FIG. 6 is a cross sectional view of the device 10 through the test points. In FIG. 6, there are a plurality of light sources in the form of LEDs 84A, 84B, 86A, 86B. Light pipes 52, 54 are shown. Each light pipe may be cylindrical in form and may collect light from more than one LED. For example, here LEDs 84A, 84B may illuminate light pipe 52. Similarly, LEDs 86A, 86B may illuminate light pipe 54 to convey light to the face of the device 10. Electrical potting compound 70 may fill an internal cavity and allows for tight component spacing within the limited size of the device. FIG. 7 is a cross sectional view of the device 10 perpendicular to the circuit boards so that both circuit boards may be more clearly shown.

Figure 8:
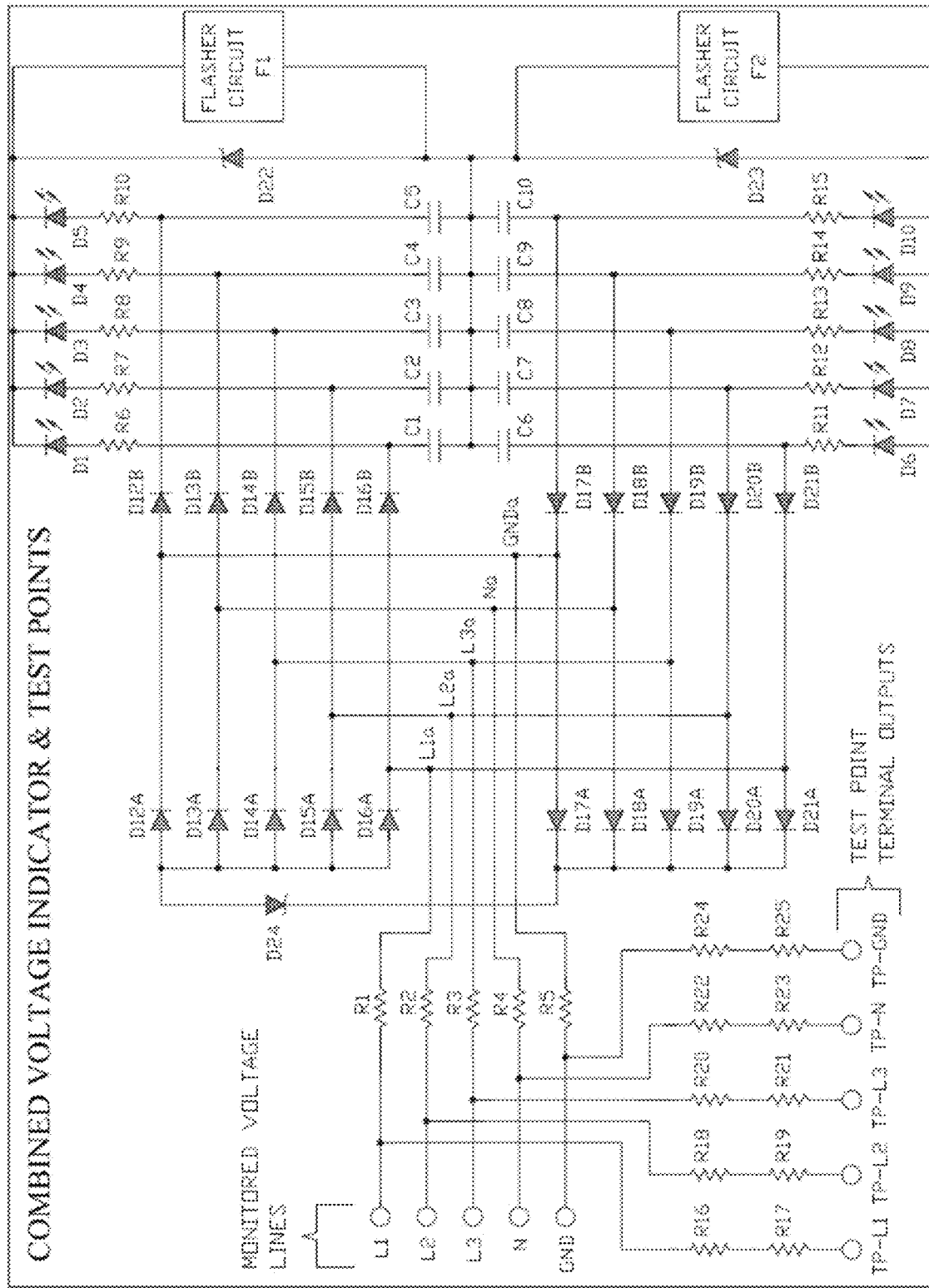
FIG. 8 illustrates one example of a circuit to provide a device with a combined voltage indicator and test points.

FIG. 8 illustrates one example of a circuit to provide a device with a combined voltage indicator and test points. In the embodiment shown, monitored voltage lines include L1, L2, L3, N, and GND. Voltage dividers are used to connect each of the line inputs to test points. Thus, R16, R17 are positioned between the L1 input and the L1 test point TP-L1. Similarly R18, R19 are positioned between the L2 input and the L2 test point TP-L2. R20, R21 are positioned between the L3 input and the L3 test point TP-L3. R22, R23 are positioned between the neutral line input N and the N test point TP-N. R24, R25 are positioned between the GND line input GND and the GND test point TP-GND.

The voltage indicator circuit is similar to that described in U.S. Pat. No. 6,703,938 to Clarke. Current-limiting resistors R1, R2, R3, R4, R5 are electrically connected to the corresponding line inputs L1, L2, L3, N, GND. Each of the inputs L1a, L2a, L3a, Na, GNDa, are then connected to two set of diodes. Thus L1a is electrically connected to D16A, D16B and D21A, D21B. L2a is electrically connected to D15A, D15B and D20A, D20B. (D12A, D21A). L3a is electrically connected to D14A, D14B and D19A, D19B. Na is electrically connected to D13A, D13B and D17A, D17B. GNDa is electrically connected to D12A, D12B and D17A, D17B. There is a first set of LEDs D1, D2, D3, D4, D5 associated with positive voltages with each LED having a resistor associated with it, namely R6, R7, R8, R9, R10. There is a second set of LEDs D6, D7, D8, D9, D10 associated with negative voltages with each LED having a resistor associated with it namely R11, R12, R13, R14, R15. There is a set of capacitors C1, C2, C3, C4, C5 associated with the positive portion of the circuit and a second set of capacitors C6, C7, C8, C9, C10 associated with the negative portion of the circuit. There is a Zener diode D22 and flasher circuit F1 associated with the positive portion of the circuit and a Zener diode D23 and flasher circuit F2 associated with the negative portion of the circuit.

Figure 10:
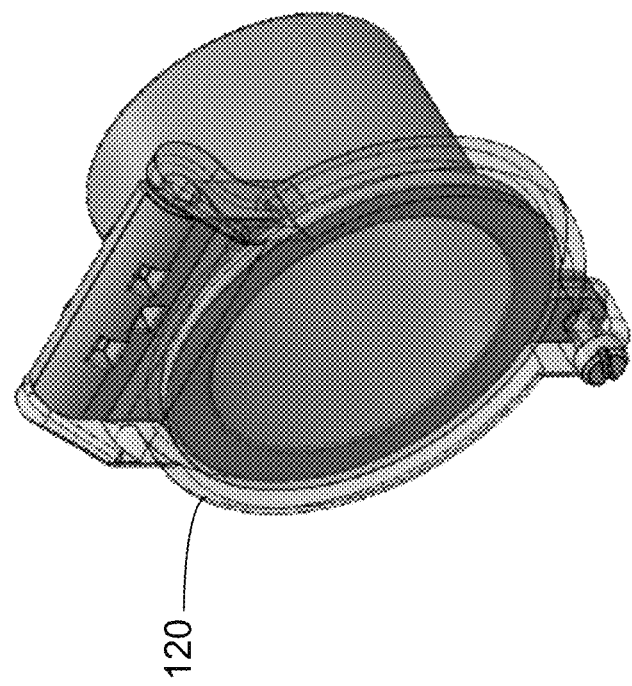
FIG. 10 is a perspective view of the transparent cover when mounted to the device.
Figure 9:
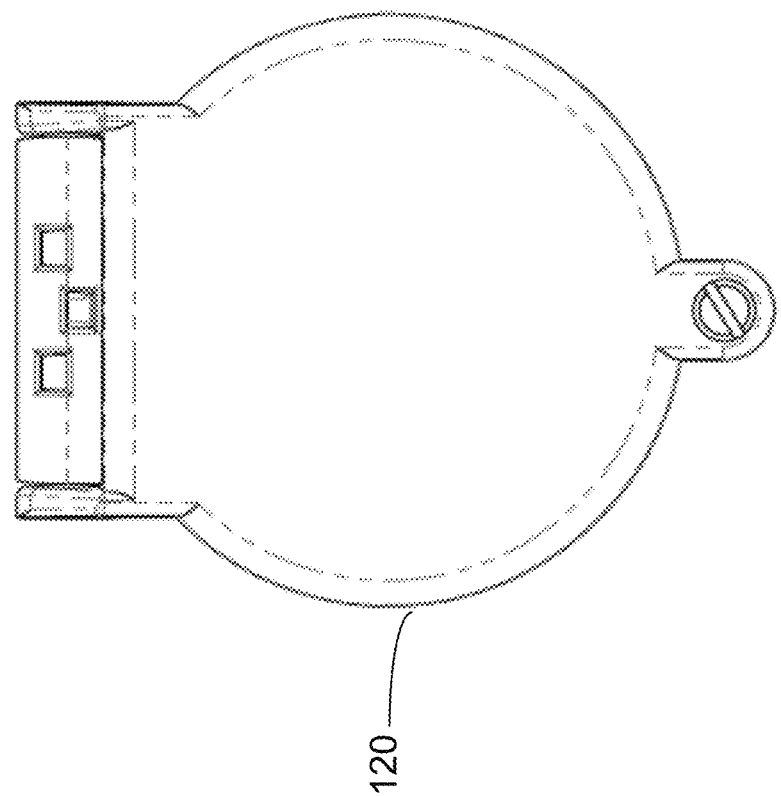
FIG. 9 is a front view of a cover for the device.

FIG. 9 is a front view of a cover 120 for the device. FIG. 10 is a perspective view of the transparent cover 120 when mounted to the device. The transparent cover 120 serves several functions. First, the transparent cover 120 provides for protection for the test points. Thus, while the cover 120 is in a closed position, the test points are not accessible. The protection provided may be UL Type 12, 13, 4, 4X protection.

However, while the cover 120 is in the closed position, because the cover 120 is transparent, LEDs or other visual indicators on the face of the device are visible. When the transparent cover 120 is in an open position, the test points are accessible and the LEDs or other visual indicators remain visible.

Figure 12:
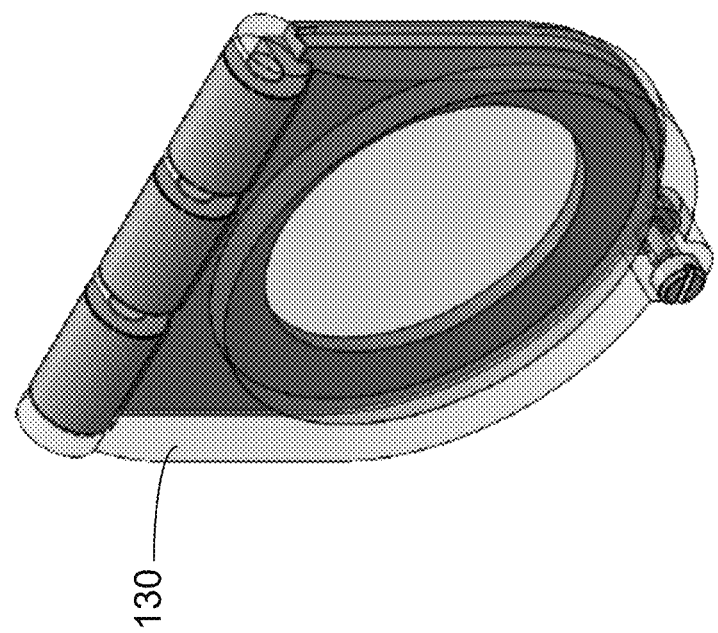
FIG. 11 and FIG. 12 illustrate an alternative example of a transparent cover.
Figure 11:
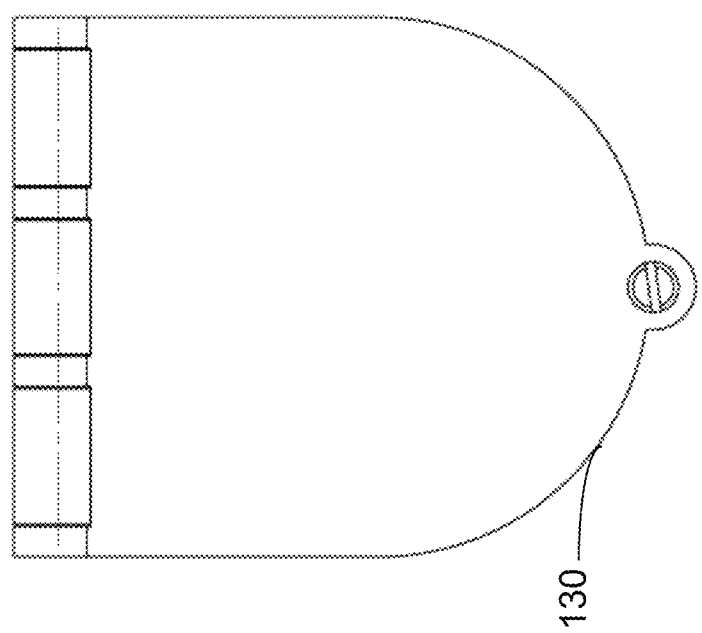

FIG. 11 and FIG. 12 illustrate an alternative example of a transparent cover 130 which may be used. It is to be understood that the cover may take on any number of other alterative shapes and configurations as may be desired in a particular application or configuration or as may be required to obtain a relevant UL rating or other meeting a relevant standard.

Another feature provided by the electrical safety monitor is that in the event of a loss of a phase, the corresponding visual indicator turns off and the visual indicator for GND is illuminated. However, when an external voltage test meter is used and the probes placed in the test points for the failed phase and a powered phase, current will travel through the voltage meter and cause the visual indicators for the failed phase to illuminate (although at a much lower intensity). This provides confirmation that the visual indicators (e.g. LEDs) and test circuit for the phase are still working.

Therefore, an electrical safety monitor with test points has been shown and described. The invention is not to be limited to the particular embodiments described herein. In particular, the invention contemplates numerous variations in the number of line puts, the position and shape of illumination area, the voltage indicator circuit, the test point circuit, the housing, and the circuit boards. The foregoing description has been presented for purposes of illustration and description. It is not intended to be an exhaustive list or limit any of the invention to the precise forms disclosed. It is contemplated that other alternatives or exemplary aspects are considered included in the invention. The description is merely examples of embodiments, processes, or methods of the invention. It is understood that any other modifications, substitutions, and/or additions can be made, which are within the intended spirit and scope of the invention.

What is claimed is:

1. An electrical safety monitor, comprising: a housing having a face; a plurality of line inputs for hardwiring a plurality of electrical connections; a plurality of meter probe test points with each of the meter probe test points corresponding to one of the line inputs, each of the plurality of meter probe test points accessible at the face of the housing; a line monitoring circuit electrically connected to a plurality of light indicators and configured to produce light if voltage exists between any two of the line inputs to thereby indicate presence of voltage to a user; illumination areas associated with each of the meter probe test points, wherein each of the illumination areas is provided light by one or more of the plurality of light indicators; wherein each of the illumination areas is positioned around a corresponding one of the meter probe test points.

2. The electrical safety monitor of claim 1 further comprising light pipes for conveying light from the plurality of light indicators to the illumination areas.

3. The electrical safety monitor of claim 1 wherein each of the meter probe test points comprises a conductive well for insertion of a test probe of a voltmeter.

4. The electrical safety monitor of claim 1 wherein the plurality of line inputs includes an L1, an L2, an L3, and a GND three-phase connection.

5. The electrical safety monitor of claim 1 wherein the plurality of line inputs include an L1, an L2, an L3, a Neutral, and a GND connection.

6. The electrical safety monitor of claim 1 further comprising a voltage test circuit electrically connected to the plurality of meter probe test points.

7. The electrical safety monitor of claim 6 wherein the voltage test circuit is associated with a voltage test circuit board.

8. The electrical safety monitor of claim 7 wherein the voltage test circuit board is a flexible circuit board.

9. The electrical safety monitor of claim 7 wherein the line monitoring circuit is associated with a line monitoring circuit board.

10. The electrical safety monitor of claim 9 wherein the line monitoring circuit board is a flexible circuit board.

11. The electrical safety monitor of claim 8 further comprising an electrical potting compound wherein at least a portion of electrical compound separates one or more components of the line monitoring circuit board from the voltage test circuit board.

12. The electrical safety monitor of claim 9 further comprising a transparent cover operatively connected to the housing for covering the face of the housing when the transparent cover is in a closed position.

13. An electrical safety monitor, comprising: a housing having a face; a plurality of input lines; a line monitoring circuit board disposed within the housing and having a line monitoring circuit associated therewith, the line monitoring circuit being electrically connected to a plurality of visual indicators such that there is at least one of the plurality of visual indicators corresponding with each of the plurality of input lines; a voltage test circuit board disposed within the housing and having a voltage test circuit associated therewith; a plurality of meter probe test points positioned at the face and electrically connected to the voltage test circuit such that each of the plurality of the meter probe test points corresponds with one of the plurality of input lines; a plurality of illumination areas positioned at the face, wherein each of the plurality of illumination areas is positioned around a corresponding one of the meter probe test points; wherein each of the illumination areas fully encircles a corresponding one of the meter probe test points.

14. The electrical safety monitor of claim 13 further comprising light pipes for conveying light from the plurality of visual indicators to the illumination areas.

15. The electrical safety monitor of claim 13 wherein each of the meter probe test points comprises a conductive well for insertion of a test probe of a voltmeter.

16. The electrical safety monitor of claim 13 wherein the plurality of line inputs includes an L1, an L2, an L3, and a GND three-phase connection.

17. The electrical safety monitor of claim 13 wherein the voltage test circuit board is a flexible circuit board.

18. The electrical safety monitor of claim 13 wherein the line monitoring circuit board is a flexible circuit board.

19. The electrical safety monitor of claim 13 further comprising an electrical potting compound wherein at least a portion of electrical compound separates one or more components of the line monitoring circuit board from the voltage test circuit board.

20. The electrical safety monitor of claim 13 further comprising a transparent cover operatively connected to the housing for covering the face of the housing when the transparent cover is in a closed position.

* * * * *